United States Patent
Chang et al.

(10) Patent No.: US 10,633,569 B2
(45) Date of Patent: Apr. 28, 2020

(54) COMPOSITION AND SOLUTION FOR TEMPORARY BONDING

(71) Applicant: TAIFLEX Scientific Co., Ltd., Kaohsiung (TW)

(72) Inventors: Hsiu-Ming Chang, Kaohsiung (TW); Tsung-Tai Hung, Kaohsiung (TW); Li-Jung Hsiao, Kaohsiung (TW); Po-Wen Lin, Kaohsiung (TW)

(73) Assignee: TAIFLEX Scientific Co., Ltd., Kaohsiung (TW)

( * ) Notice: Subject to any disclaimer, the term of this patent is extended or adjusted under 35 U.S.C. 154(b) by 67 days.

(21) Appl. No.: 16/016,660

(22) Filed: Jun. 25, 2018

(65) Prior Publication Data
US 2019/0292429 A1   Sep. 26, 2019

(30) Foreign Application Priority Data

Mar. 23, 2018 (TW) .............. 107109943 A

(51) Int. Cl.
| | |
|---|---|
| *C09J 11/04* | (2006.01) |
| *C08K 3/36* | (2006.01) |
| *C08K 3/04* | (2006.01) |
| *C09J 9/00* | (2006.01) |
| *C08G 69/32* | (2006.01) |
| *C09J 177/06* | (2006.01) |
| *H01L 21/683* | (2006.01) |

(52) U.S. Cl.
CPC ............ *C09J 177/06* (2013.01); *C08G 69/32* (2013.01); *C08K 3/04* (2013.01); *C08K 3/36* (2013.01); *C09J 9/00* (2013.01); *C09J 11/04* (2013.01); *H01L 21/6835* (2013.01); *H01L 2221/68327* (2013.01); *H01L 2221/68381* (2013.01)

(58) Field of Classification Search
CPC . C09J 177/06; C09J 9/00; C09J 11/04; C08G 69/32; C08K 3/04; C08K 3/36; H01L 21/6835; H01L 2221/68327; H01L 2221/68381
USPC ........................................................ 524/600
See application file for complete search history.

(56) References Cited

U.S. PATENT DOCUMENTS

2016/0023436 A1   1/2016  Liu et al.

FOREIGN PATENT DOCUMENTS

| CN | 1703773 | 11/2005 |
|---|---|---|
| CN | 103242981 | 8/2013 |
| WO | WO 2015/101135 A1 * | 7/2015 |

\* cited by examiner

*Primary Examiner* — William K Cheung
(74) *Attorney, Agent, or Firm* — JCIPRNET

(57) ABSTRACT

A composition and a solution for temporary bonding are provided. The composition includes a dianhydride monomer, a light-absorbing monomer, and a light-absorbing material. The light-absorbing monomer includes at least one of N,N,N,N-(p-aminophenyl)-p-phenylenediamine (TPDA) and N,N-(p-aminophenyl)-p-phenylenediamine (DPDA). The light-absorbing material includes carbon black and silicon dioxide.

9 Claims, No Drawings

COMPOSITION AND SOLUTION FOR TEMPORARY BONDING

CROSS-REFERENCE TO RELATED APPLICATION

This application claims the priority benefit of Taiwan application serial no. 107109943, filed on Mar. 23, 2018. The entirety of the above-mentioned patent application is hereby incorporated by reference herein and made a part of this specification.

BACKGROUND OF THE INVENTION

Field of the Invention

The invention relates to a composition and a solution for temporary bonding, and more particularly, to a composition and a solution for temporary bonding containing a highly light-absorbing material.

Description of Related Art

With the development of the microelectronics industry and the drive of the electronics market, semiconductor packaging techniques are moving toward smaller size, lighter weight, and better performance. To provide better heat dissipation and longer life to a wafer during use and to facilitate subsequent system packaging, the thickness of the wafer generally needs to be reduced to 100 µm. In general, a wafer device is first temporarily adhered to a thicker carrying glass, a certain thickness is reduced by performing treatments such as corrosion and polishing on the back of the wafer, and then the adhesive layer is disabled via external light, electricity, heat, or force to separate the wafer device and the carrier, wherein the adhere-then-release temporary bonding layer has a critical influence on whether the process can be successfully implemented. More specifically, the temporary bonding layer plays a rather important role in conditions of temporary fixing in wafer stacking, thick wafer thinning, temporary fixing in cutting, and temporary fixing in transportation.

In prior art, the debonding method of the temporary bonding layer includes UV irradiation debonding, solvent debonding, or laser debonding. The heat-resistant temperature of UV irradiation debonding is about 120° C., and a temperature of 260° C. cannot be tolerated. Therefore, daily damage readily occurs, such that a debonding reaction occurs prematurely. The drawback of solvent debonding is poor solvent resistance, which results in process limitations. Therefore, the solvent debonding does not meet market demand. The heat resistance and chemical resistance of laser debonding are better, but the adhesion is generally lost only under laser irradiation at a wavelength of 355 nm or 532 nm, and laser debonding is less suitable for laser having a wavelength of 1064 nm. Therefore, the red laser is less suitable for debonding.

Based on the above, the development of a temporary bonding layer reducing adhesion via laser absorption to increase laser wavelength absorption is an important topic requiring research.

SUMMARY OF THE INVENTION

The invention provides a composition for temporary bonding containing a highly light-absorbing material and having good heat resistance, chemical resistance, and adhesion, and the adhesion can be reduced by absorbing a laser having a wavelength of 1064 nm.

The composition for temporary bonding of the invention includes a dianhydride monomer, a light-absorbing monomer, and a light-absorbing material, wherein the light-absorbing monomer includes at least one of N,N,N,N-(p-aminophenyl)-p-phenylenediamine (TPDA) and N,N-(p-aminophenyl)-p-phenylenediamine (DPDA), and the light-absorbing material includes carbon black and silicon dioxide.

In an embodiment of the invention, the dianhydride monomer is one of 2,3,3',4'-diphenylether tetracarboxylic dianhydride (PDMS), 3,3',4,4'-biphenyltetracarboxylic dianhydride (BPDA), 3,3',4,4'-benzophenone tetracarboxylic dianhydride (BTDA), and 3,3',4,4'-diphenylether tetracarboxylic dianhydride (OPDA).

In an embodiment of the invention, based on the total weight of the composition for temporary bonding, the amount of the dianhydride monomer is 10 wt % to 40 wt %, the amount of the light-absorbing monomer is 10 wt % to 20 wt %, and the amount of the light-absorbing material is 20 wt % to 50 wt %.

In an embodiment of the invention, the composition for temporary bonding further includes a solvent, and the solvent includes N-methylpyrrolidone (NMP), dimethylacetamide (DMAC), or cyclohexanone.

In an embodiment of the invention, based on the total weight of the composition for temporary bonding, the amount of the solvent is 10 wt % to 60 wt %.

In an embodiment of the invention, the composition for temporary bonding loses adhesion under laser irradiation at a wavelength of 1064 nm.

In an embodiment of the invention, a heat-resistant temperature of the composition for temporary bonding is 350° C. to 450° C.

The invention provides a solution for temporary bonding including the aforementioned composition for temporary bonding, and the solution for temporary bonding can be coated via spin coating.

In an embodiment of the invention, the aforementioned composition for temporary bonding is diluted via a solvent to prepare the solution for temporary bonding, and a dilution ratio is 10% to 60%.

Based on the above, the composition for temporary bonding of the invention includes a dianhydride monomer with high heat resistance to achieve good heat resistance and adhesion, contains light-absorbing monomers (DPDA and TPDA) to increase laser wavelength absorption, and contains light-absorbing materials (carbon black and silicon dioxide) to absorb and refract light. As a result, the composition for temporary bonding of the invention can reduce adhesion by absorbing a laser having a wavelength of 1064 nm, and further has good heat resistance, chemical resistance, and adhesion.

In order to make the aforementioned features and advantages of the invention more comprehensible, embodiments are described in detail below.

DESCRIPTION OF THE EMBODIMENTS

In the present specification, a range represented by "a numerical value to another numerical value" is a schematic representation for avoiding listing all of the numerical values in the range in the specification. Therefore, the recitation of a specific numerical range covers any numerical value in the numerical range and a smaller numerical range defined by any numerical value in the numerical range, as is the case with the any numerical value and the smaller numerical range stated explicitly in the specification.

The invention provides a composition for temporary bonding that can be used to prepare a solution for temporary bonding, and has the advantages of good heat resistance, good chemical resistance, and low moisture absorption. In the following, embodiments are provided as examples of actual implementation of the invention.

<Composition for Temporary Bonding>

The composition for temporary bonding of the invention includes a dianhydride monomer, a light-absorbing monomer, a light-absorbing material, and a solvent. Hereinafter, the various components above are described in detail.

<Dianhydride Monomer>

In the present embodiment, the dianhydride monomer includes, for instance, one of the following structures:
2,3,3',4'-diphenylether tetracarboxylic dianhydride (PDMS)

Structural formula (I)

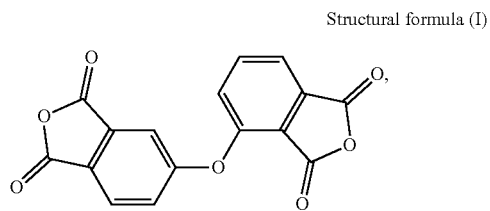 [SMILES: O=C1OC(=O)c2cc(Oc3cccc4c3C(=O)OC4=O)ccc21]

3,3',4,4'-biphenyltetracarboxylic dianhydride (BPDA)

Structural formula (II)

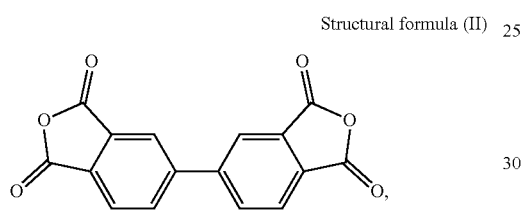

3,3',4,4'-benzophenone tetracarboxylic dianhydride (BTDA)

Structural formula (III)

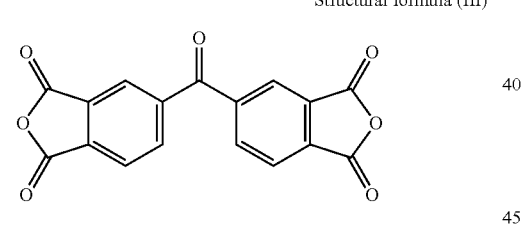

and
3,3',4,4'-diphenylether tetracarboxylic dianhydride (OPDA)

Structural formula (IV)

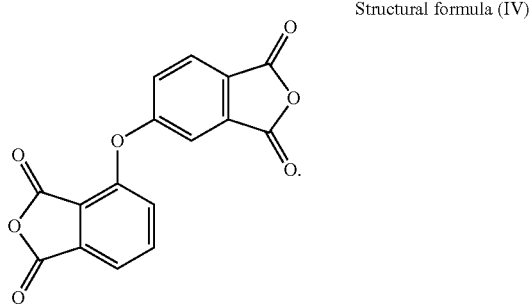 [SMILES: O=C1OC(=O)c2cc(Oc3cccc4c3C(=O)OC4=O)ccc21]

Based on the total weight of the composition for temporary bonding, the amount of the dianhydride monomer is, for instance, 10 wt % to 40 wt %. The addition of the dianhydride monomer can increase the heat resistance and adhesion of the composition for temporary bonding and the solution prepared therefrom in the subsequent process. Therefore, the issue of poor heat resistance in the UV irradiation debonding technique in prior art can be alleviated. The composition for temporary bonding of the invention contains a high heat-resistant dianhydride monomer, and the heat-resistant temperature is, for instance, greater than 260° C., and more specifically is, for instance, 350° C. to 450° C., and can reach 410° C.

<Light-Absorbing Monomer>

In the present embodiment, the light-absorbing monomer can include at least one of N,N,N,N-(p-aminophenyl)-p-phenylenediamine (TPDA) and N,N-(p-aminophenyl)-p-phenylenediamine (DPDA), which can be represented by the following chemical structure formulas:

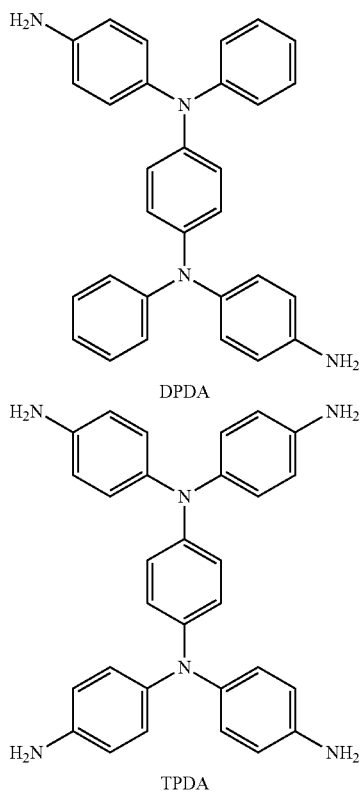

Based on the total weight of the composition for temporary bonding, the amount of the light-absorbing monomer is 10 wt % to 20 wt %, for instance. The addition of the light-absorbing monomer can increase laser wavelength absorption.

<Light-Absorbing Material>

In the present embodiment, the light-absorbing material can include carbon black and silicon dioxide ($SiO_2$). Based on the total weight of the composition for temporary bonding, the amount of the light-absorbing material is 20 wt % to 50 wt %, for instance. The addition of the light-absorbing material can absorb and refract light, such that the composition for temporary bonding of the invention can lose adhesion under laser irradiation at a wavelength of 1064 nm to achieve good debonding feature. In comparison to the laser debonding technique in prior art capable of debonding only under laser irradiation at a wavelength of 355 nm or 532 nm, the invention is more advantageous.

<Solvent>

In the present embodiment, the solvent can include N-methylpyrrolidone (NMP), dimethylacetamide (DMAC), or cyclohexanone. Based on the total weight of the composition for temporary bonding, the amount of the solvent is 10 wt % to 60 wt %, for instance.

<Solution for Temporary Bonding>

The solution for temporary bonding of the invention includes the aforementioned composition for temporary bonding and a solvent, can be coated via spin coating, and the coating thickness is 0.5 μm to 5 μm, for instance. In the present embodiment, the solvent can include N-methylpyrrolidone (NMP). The composition for temporary bonding is diluted via the solvent to prepare the solution for temporary bonding, and the dilution ratio is 10% to 60%, for instance. More specifically, when the coating thickness is 0.6 μm, under laser irradiation at a wavelength of 1064 nm, an absorption Abs is about 1.8 and the transmittance is about 2%.

In the following, experimental examples are provided to describe the composition for temporary bonding and the resulting solution of the embodiments above in detail. However, the following experimental example is not intended to limit the disclosure.

Experimental Example

To prove that the composition for temporary bonding and the resulting solution provided in the invention have properties such as good heat resistance and chemical resistance, the following experimental example is provided.

Preparation of Thin Film

A dianhydride monomer, a light-absorbing monomer, a light-absorbing material, and a solvent were stirred for one hour at room temperature according to the ratios of the compositions for temporary bonding of the invention shown in Table 1 below (including Example 1, Example 2, and Example 3). Next, the mixture was coated on a 700 μm glass at a thickness of about 1 μm, and then the glass was placed in an oven to be baked at 160° C. for 2 minutes to dry the surface. Afterwards, baking was performed at 350° C. for half an hour to obtain a thin film (A) of composition for temporary bonding temporarily disposed on a glass surface. After the thin film (A) of composition for temporary bonding was removed from the glass, a thin film (B) of composition for temporary bonding of the invention was obtained, with a thickness of about 1 μm.

TABLE 1

|  | Example 1 | Example 2 | Example 3 |
| --- | --- | --- | --- |
| OPDA | 15 wt % | 15 wt % | 15 wt % |
| DPDA | 20 wt % | 10 wt % | 0 |
| TPDA | 0 | 10 wt % | 20 wt % |
| Carbon black | 30 wt % | 35 wt % | 40 wt % |
| Silicon dioxide | 15 wt % | 10 wt % | 5 wt % |
| NMP | 20 wt % | 20 wt % | 20 wt % |

Titanium-Coated Copper Test

A Ti/Cu layer (thicknesses of Ti/Cu were respectively 100 nm/200 nm) was disposed on the thin film (A) formed using the ratio of Example 1 in Table 1. Via a titanium-coated copper test, it can be known that the film surface of titanium-coated copper was normal without cracks, and cracking was still not observed after high-temperature aging at a temperature of 230° C. for 2 hours.

Thermal Decomposition Temperature

The temperature at 5 wt % loss of the thin film (B) formed at the ratios of Example 1 in Table 1 was measured via a thermogravimetric analyzer (TGA) as the thermal decomposition temperature. The measured thermal decomposition temperature was 410° C., which met the requirement of greater than 300° C.

TMAH Resistance Test 2.38% tetramethylammonium hydroxide (TMAH) was reacted with the thin film (A) formed at the ratios of Example 1 in Table 1 at different temperatures and different reaction times, and then the weight loss percentage was measured and chemical resistance was evaluated. The measurement results are shown in Table 2 below.

TABLE 2

|  | Reaction temperature | | |
| --- | --- | --- | --- |
| Reaction time | 26° C. | 50° C. | 80° C. |
| 10 minutes | 0.2% | 1.1% | 3.2% |
| 20 minutes | 0.1% | 2.4% | 5.8% |
| 30 minutes | 0.2% | 5.2% | 7.5% |

Chemical Resistance Test (Example 1, Thin Film (A))

The thin film (A) formed at the ratios of Example 1 in Table 1 was soaked in different chemical agents shown in Table 3 below for 10 minutes, and then measurement was performed with a force gauge. When the measurement result was higher than 550 g/cm, good chemical resistance was achieved. The measurement results are shown in Table 3 below, and it can be known that after the temporary bonding layer formed by the solution for temporary bonding of the invention was soaked in various different chemical agents, good chemical resistance was achieved, and high chemical resistance was still achieved even after soaking in PGMEA commonly used in solvent debonding. Therefore, the composition for temporary bonding of the invention can overcome process limitations caused by poor solvent resistance in prior art and better meet market demand.

TABLE 3

| Chemical agents | Measurement results (g/cm) |
| --- | --- |
| NMP | 552 |
| 30% HCl | 563 |
| 10% NaOH | 550 |
| PGMEA | 570 |
| Methanol | 585 |
| Acetone | 577 |

Debonding Test

The thin films (A) respectively formed at the ratios of Example 1, Example 2, and Example 3 in Table 1 were debonded via laser irradiation at a wavelength of 1064 nm at different powers. The evaluation results are shown in Table 4 below, wherein O represents a debonding opening area of 80 μm to 100 μm, Δ represents a debonding opening area of 50 μm to 80 μm, and X represents a debonding opening area of 0 μm to 50 μm.

TABLE 4

| Power | Example 1 | Example 2 | Example 3 |
| --- | --- | --- | --- |
| 18 W | O | O | O |
| 16 W | O | O | O |
| 12 W | O | O | O |
| 9 W | O | O | O |

TABLE 4-continued

| Power | Example 1 | Example 2 | Example 3 |
|---|---|---|---|
| 5 W | X | Δ | ○ |
| 3 W | X | X | Δ |

Adhesion and Peel Strength Test

The thin films (A) respectively formed at the ratios of Example 1, Example 2, and Example 3 in Table 1 were used. The evaluation method of adhesion adopted an adhesion cross-cut test, and the measurement method involved making 10×10 (100) 1 mm×1 mm small squares on a test sample (glass material) surface using a cross-cut tester, with each line reaching the bottom layer. Next, the debris in the test region were brushed off with a brush, then an adhesive tape was securely attached to the small squares for testing, and then the tape was wiped hard with an eraser to increase the contact area and force of the tape and the test region. Afterwards, one end of the tape was grabbed by a hand, and the tape was rapidly torn off in a vertical direction. The evaluation results are shown in Table 5 below, wherein a measurement result of 5B indicates good adhesion. Moreover, Table 5 also shows the measurement results of peel strength.

TABLE 5

| | Example 1 | Example 2 | Example 3 |
|---|---|---|---|
| Cross-cut test | 5B | 5B | 5B |
| Peel strength (g/cm) | 430 | 525 | 480 |

Transmittance Test

The thin films (A) respectively formed at the ratios of Example 1, Example 2, and Example 3 in Table 1 were placed in a full-spectrum analyzer for testing, wherein the thin films (A) had different thicknesses. Table 6 below shows the evaluation results of the transmission test (532 nm T.T).

TABLE 6

| | Example 1 | Example 2 | Example 3 |
|---|---|---|---|
| 0.5 | 10% | 8% | 5% |
| 1 | 5% | 2.8% | 1% |
| 1.5 | 3% | 2.4% | 0% |
| 2 | 2.6% | 1% | 0% |

Based on the above, the composition for temporary bonding of the invention contains a dianhydride monomer (OPDA) with high heat resistance to achieve good heat resistance and adhesion, contains light-absorbing monomers (DPDA and TPDA) to increase laser wavelength absorption, and contains light-absorbing materials (carbon black and silicon dioxide) to absorb and refract light. As a result, the composition for temporary bonding of the invention can reduce adhesion by absorbing a laser having a wavelength of 1064 nm, and has good debonding feature. In comparison to the laser debonding technique in prior art capable of debonding only via laser irradiation at a wavelength of 355 nm or 532 nm, the invention is capable of debonding using red laser and is therefore more advantageous. Moreover, the composition for temporary bonding of the invention further has good heat resistance, chemical resistance, and adhesion, and can solve the issue of poor heat resistance and solvent resistance of UV irradiation debonding and solvent debonding techniques in prior art, so as to overcome process limitations and better meet market demand.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A composition for temporary bonding, comprising:
   a dianhydride monomer;
   a light-absorbing monomer comprising at least one of N,N,N,N-(p-aminophenyl)-p-phenylenediamine (TPDA) and N,N-(p-aminophenyl)-p-phenylenediamine (DPDA); and
   a light-absorbing material comprising carbon black and silicon dioxide.

2. The composition for temporary bonding of claim 1, wherein the dianhydride monomer is one of 2,3,3',4'-diphenylether tetracarboxylic dianhydride (PDMS), 3,3',4,4'-biphenyltetracarboxylic dianhydride (BPDA), 3,3',4,4'-benzophenone tetracarboxylic dianhydride (BTDA), and 3,3',4,4'-diphenylether tetracarboxylic dianhydride (OPDA).

3. The composition for temporary bonding of claim 1, wherein based on a total weight of the composition for temporary bonding, an amount of the dianhydride monomer is 10 wt % to 40 wt %, an amount of the light-absorbing monomer is 10 wt % to 20 wt %, and an amount of the light-absorbing material is 20 wt % to 50 wt %.

4. The composition for temporary bonding of claim 1, further comprising a solvent, and the solvent comprises N-methylpyrrolidone (NMP), dimethylacetamide (DMAC), or cyclohexanone.

5. The composition for temporary bonding of claim 4, wherein based on a total weight of the composition for temporary bonding, an amount of the solvent is 10 wt % to 60 wt %.

6. The composition for temporary bonding of claim 1, wherein the composition for temporary bonding loses adhesion under a laser irradiation at a wavelength of 1064 nm.

7. The composition for temporary bonding of claim 1, wherein a heat-resistant temperature of the composition for temporary bonding is 350° C. to 450° C.

8. A solution for temporary bonding, comprising the composition for temporary bonding of claim 1.

9. The solution for temporary bonding of claim 8, wherein the composition for temporary bonding is diluted via a solvent to prepare the solution for temporary bonding, and a dilution ratio is 10% to 60%.

* * * * *